United States Patent
Wu

(10) Patent No.: US 11,011,588 B2
(45) Date of Patent: May 18, 2021

(54) DISPLAY DEVICE

(71) Applicant: Wuhan China Star Optoelectronics Semiconductor Display Technology Co., Ltd., Hubei (CN)

(72) Inventor: Mengying Wu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 29 days.

(21) Appl. No.: 16/622,578

(22) PCT Filed: Sep. 19, 2019

(86) PCT No.: PCT/CN2019/106817
§ 371 (c)(1),
(2) Date: Dec. 13, 2019

(87) PCT Pub. No.: WO2021/035841
PCT Pub. Date: Mar. 4, 2021

(65) Prior Publication Data
US 2021/0066408 A1  Mar. 4, 2021

(30) Foreign Application Priority Data
Aug. 26, 2019  (CN) .......................... 201910792060.4

(51) Int. Cl.
| | |
|---|---|
| H01L 27/32 | (2006.01) |
| H01L 51/00 | (2006.01) |
| H01L 51/56 | (2006.01) |
| G02B 3/08 | (2006.01) |
| H01L 27/146 | (2006.01) |

(52) U.S. Cl.
CPC ............ *H01L 27/3234* (2013.01); *G02B 3/08* (2013.01); *H01L 27/3244* (2013.01); *H01L 51/0097* (2013.01); *H01L 51/56* (2013.01); H01L 27/14625 (2013.01); H01L 27/14627 (2013.01); H01L 27/14629 (2013.01); H01L 2227/323 (2013.01); H01L 2251/5338 (2013.01)

(58) Field of Classification Search
None
See application file for complete search history.

(56) References Cited

U.S. PATENT DOCUMENTS

2018/0224715 A1* 8/2018 Coughenour .......... G03B 15/05

FOREIGN PATENT DOCUMENTS

WO  WO-2020215878 A1 * 10/2020 .............. H04M 1/02

OTHER PUBLICATIONS

Machine Translation of WO 2020/215878 (Year: 2020).*

\* cited by examiner

Primary Examiner — J. E. Schoenholtz

(57) ABSTRACT

A display device is provided. The display device includes a first base layer, a second base layer, a thin film transistor layer, an organic light-emitting layer, a display region, and a light-transmissive sub-region. At the same time, a through hole and a light-guiding lens structure are disposed, and the through hole is filled with a light-guiding medium. After light passes through the light-guiding medium and the light-guiding lens structure, light transmittance is high, and brightness of each region is kept uniform, thereby improving imaging quality and imaging function of the display device.

19 Claims, 4 Drawing Sheets

DISPLAY DEVICE

FIELD OF INVENTION

The present disclosure relates to the field of display technologies, and in particular, to a display device.

BACKGROUND OF INVENTION

With rapid development of modern display technology, display technology field is moving toward a more light-weight, thinner, softer, light-transmissive, and larger screen ratio, while functions of display devices are also continuously increasing.

In order to further increase screen ratio of a display screen in a display panel, researchers proposed a technical scheme of an under-screen camera. In terms of appearance, a surface of the display screen prepared by the under-screen camera technology saves an original camera hole, and screen ratio and integration of the entire display panel are greater. In order to ensure display effect of the display screen, the under-screen camera technology requires high transmittance of a camera region. However, the display panel of current under-screen camera technology is generally made of a polyimide flexible substrate, and designed display panels have simple structure. Meanwhile, average optical transmittance of visible light band of a substrate made of such material is relatively low, only about 70%, and along with superposition of various layers, an overall transmittance of the display panel will be further reduced. Thereby, when the camera region of the display panel is used for photographing, light cannot completely enter the camera region due to low transmittance, leading to poor image quality of pictures, which in turn affects display effect.

Therefore, it is necessary to propose a solution to the problems in the conventional art.

TECHNICAL PROBLEM

In summary, in current under-screen camera technology, there is simple structural design of inner panel of display device, and optical transmittance is low. At the same time, when an image is being captured, light cannot completely enter the panel, resulting in low light transmittance, poor image quality of picture, poor camera effect, and unsatisfactory display effect.

SUMMARY OF INVENTION

Technical Solution

In order to solve the above problems, the present disclosure provides a display device to solve the problems that a structural design of panel in the conventional display devices is single, and optical transmittance of display panels is low, imaging function is not satisfactory, and display effect is poor.

To solve the above technical problems, technical solution provided by the embodiment of the present disclosure is described as follows.

According to a first aspect of the embodiments of the present disclosure, a display device is provided, including:
a display region comprising a light-transmissive sub-region for transmitting light to an under-screen camera, the display device comprising: a first base layer;
a second base layer disposed on the first base layer;
a thin film transistor layer disposed on the second base layer; and
an organic light-emitting layer disposed on the thin film transistor layer,
wherein the second base layer and the thin film transistor layer are provided with a through hole corresponding to the light-transmissive sub-region, the through hole comprises a stepped hole, and the through hole is filled with a light-guiding medium,
wherein a side of the first base layer facing the second base layer is provided with a light-guiding lens structure corresponding to the light-transmissive sub-region, and the light-guiding lens structure comprises a Fresnel lens.

According to an embodiment of the present disclosure, a side of the light-guiding lens structure is provided with a plurality of equidistant zigzag shapes, and the equidistant zigzag shapes form a plurality of concentric circles on a surface of the light-guiding lens structure.

According to an embodiment of the present disclosure, a first base layer comprises:
a first flexible layer, wherein a thickness of the first flexible layer corresponding to the light-transmissive sub-region is less than a thickness of the first flexible layer corresponding to the display region excluding the light-transmissive sub-region; and
a first barrier layer disposed on the first flexible layer, wherein the light-guiding lens structure is disposed on a side of the first barrier layer away from the first flexible layer and corresponding to the light-transmissive sub-region.

According to an embodiment of the present disclosure, a side of the first flexible layer away from the first barrier layer is provided with a groove corresponding to the light-transmissive sub-region.

According to an embodiment of the present disclosure, a second base layer comprises:
a second flexible layer disposed on the first barrier layer; and
a second barrier layer disposed on the second flexible layer,
wherein the second flexible layer and the second barrier layer are provided with a through hole corresponding to the light-transmissive sub-region.

According to an embodiment of the present disclosure, an aperture diameter of the stepped hole in the thin film transistor layer is less than an aperture diameter of the stepped hole in a corresponding region of the second base layer.

According to an embodiment of the present disclosure, a periphery of the light-guiding medium comprises a reflective layer, the reflective layer enclosing the light-guiding medium and conforming to an inner surface of the through hole.

According to an embodiment of the present disclosure, an organic light-emitting layer comprises a plurality of pixel units, and a density of the pixel units in the display region is greater than a density of the pixel units in the light-transmissive sub-region.

According to an embodiment of the present disclosure, material of the light-guiding medium comprises polyimide.

According to a second aspect of the embodiments of the present disclosure, a display device is further provided, including:
a display region comprising a light-transmissive sub-region for transmitting light to an under-screen camera, the display device comprising:
a first base layer;
a second base layer disposed on the first base layer;

a thin film transistor layer disposed on the second base layer; and an organic light-emitting layer disposed on the thin film transistor layer, wherein the second base layer and the thin film transistor layer are provided with a through hole corresponding to the light-transmissive sub-region, and the through hole is filled with a light-guiding medium, wherein a side of the first base layer facing the second base layer is provided with a light-guiding lens structure corresponding to the light-transmissive sub-region.

According to an embodiment of the present disclosure, the light-guiding lens structure comprises a Fresnel lens.

According to an embodiment of the present disclosure, a side of the light-guiding lens structure is provided with a plurality of equidistant zigzag shapes, and the equidistant zigzag shapes form a plurality of concentric circles on a surface of the light-guiding lens structure.

According to an embodiment of the present disclosure, a first base layer comprises:

a first flexible layer, wherein a thickness of the first flexible layer corresponding to the light-transmissive sub-region is less than a thickness of the first flexible layer corresponding to the display region excluding the light-transmissive sub-region; and a first barrier layer disposed on the first flexible layer, wherein the light-guiding lens structure is disposed on a side of the first barrier layer away from the first flexible layer and corresponding to the light-transmissive sub-region.

According to an embodiment of the present disclosure, a side of the first flexible layer away from the first barrier layer is provided with a groove corresponding to the light-transmissive sub-region.

According to an embodiment of the present disclosure, a second base layer comprises:

a second flexible layer disposed on the first barrier layer; and a second barrier layer disposed on the second flexible layer, wherein the second flexible layer and the second barrier layer are provided with a through hole corresponding to the light-transmissive sub-region.

According to an embodiment of the present disclosure, each of the through hole comprises a stepped hole, and an aperture diameter of the stepped hole in the thin film transistor layer is less than an aperture diameter of the stepped hole in a corresponding region of the second base layer.

According to an embodiment of the present disclosure, a periphery of the light-guiding medium comprises a reflective layer, the reflective layer enclosing the light-guiding medium and conforming to an inner surface of the through hole.

According to an embodiment of the present disclosure, an organic light-emitting layer comprises a plurality of pixel units, and a density of the pixel units in the display region is greater than a density of the pixel units in the light-transmissive sub-region.

According to an embodiment of the present disclosure, material of the light-guiding medium comprises polyimide.

Beneficial Effect

In summary, beneficial effects of the embodiments of the present disclosure are as follows.

The present disclosure provides a new display device, wherein a first barrier layer is disposed on a base layer and a light-guiding lens structure is further disposed on the corresponding first barrier layer in the light-transmissive sub-region, and the light-guiding lens structure includes a Fresnel lens. When light passes through the Fresnel lens, light will be focused on camera without shadows of light, and will not affect light transmission. At the same time, in order to improve light transmittance, a through hole is formed, and the through hole is filled with a light-guiding medium to further improve transmittance of light, as well as improve imaging and display effect.

DETAILED DESCRIPTION OF EMBODIMENTS

The following description of the various embodiments is provided with accompanying drawings, which are used to illustrate specific embodiments for which the present disclosure can be practiced.

Figure 1:
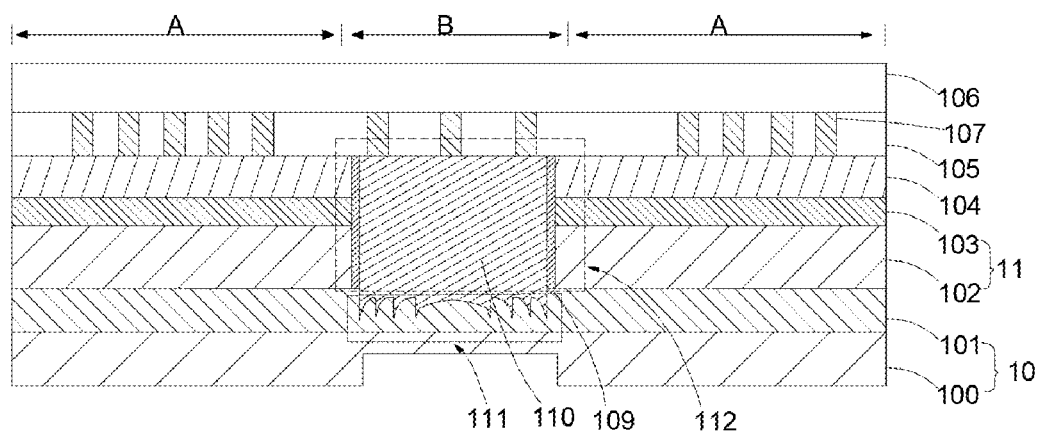
FIG. 1 is a schematic structural view of each layer of a display device according to an embodiment of the present disclosure.

In an embodiment of the present disclosure, as shown in FIG. 1, FIG. 1 is a schematic structural diagram of each layer of a display device according to the embodiment of the present disclosure. The display device includes a first base layer 10, a second base layer 11, a thin film transistor layer 104, and an organic light-emitting layer 105. The second base layer 11 is disposed on the first base layer 10, the thin film transistor layer 104 is disposed on the second base layer 11, and the organic light-emitting layer 105 is disposed on the thin film transistor layer 104.

Specifically, the first base layer 10 includes a first flexible layer 100 and a first barrier layer 101, and the second base layer 11 includes a second flexible layer 102 and a second barrier layer 103.

Each of the above film layers is sequentially disposed, wherein the first barrier layer 101 is disposed on the first flexible layer 100, the second flexible layer 102 is disposed on the first barrier layer 101, the second barrier layer 103 is disposed on the second flexible layer 102, and the thin film transistor layer 104 is disposed on the second barrier layer 103.

The display device further includes a protective layer 106 disposed on the organic light-emitting layer 105. The protective layer 106 encapsulates the film layers of entire display device to prevent external moisture from entering the display device and affecting service life of the device.

As shown in FIG. 1, in entire display device, a display region A further includes a light-transmissive sub-region B. The display region A is disposed around the light-transmissive sub-region B, and a lower part of the display device corresponding to the light-transmissive sub-region B is provided with an imaging device, such as a camera. External light passes through the light-transmissive sub-region B and is transmitted to the imaging device to realize function of photography.

In the embodiment of the present disclosure, in order to improve light transmittance of the display device, the display device is further provided with a through hole 112. The through hole 112 is disposed in the second flexible layer 102, the second barrier layer 103, and the thin film transistor layer 104 corresponding to the light-transmissive sub-region B.

Specifically, the through hole 112 is filled with a light-guiding medium 110. The light-guiding medium 110 is mainly a light-transmitting medium, including a polyimide material. At the same time, in order to increase light transmittance and allow light entering the through hole 112 from an upper end of the through hole 112 to fully pass through a lower end of the through hole 112, the through hole 112 can be set as a tapered hole. An aperture diameter at a top of the tapered hole can be greater than an aperture diameter at a bottom of the tapered hole, or the aperture diameter at the top of the tapered hole can be less than the aperture diameter at the bottom of the tapered hole, according to selection of specific products. This saves more material and reduces cost.

In order to reduce loss of light in the light-guiding medium 110 and reflect light into other film layers, a reflective layer 109 is disposed in an outer periphery of the light-guiding medium 110, and the reflective layer 109 encloses the light-guiding medium 110, while the reflecting layer 109 is conformed to an inner surface of the through hole 112. The inner surface of the reflective layer 109 is smooth, which can effectively prevent light from reflecting from the through hole 112 into each film layers of the display device. The reflective layer 109 can also block remaining impurities from entering the through hole 112, which has a certain protective effect on entire device.

In order to increase external light incident into the through hole 112, in the embodiment of the present disclosure, a light-guiding lens structure 111 is further disposed on the first barrier layer 101, and the light-guiding lens structure 111 is disposed on the first barrier layer 101 corresponding to the light-transmissive sub-region B. The light-guiding lens structure 111 in the embodiment of the present disclosure is not an ordinary optical lens, and a plurality of equidistant zigzag shapes are disposed in the light-guiding lens structure 111.

Figure 2:
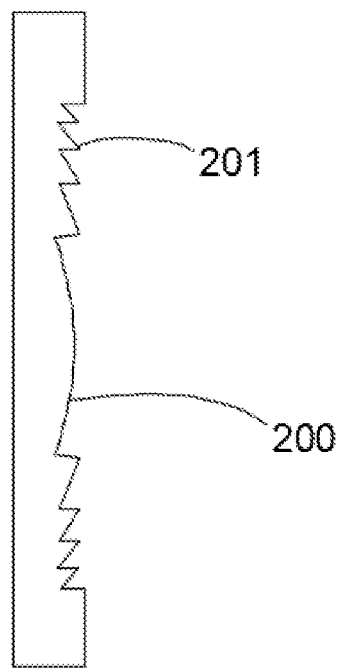
FIG. 2 is a schematic view of a light-guiding lens structure according to the embodiment of the present disclosure.

Specifically, as shown in FIG. 2, FIG. 2 is a schematic view of a lens structure according to the embodiment of the present disclosure. A lens 200 includes a plurality of zigzag shapes 201 that are equidistantly disposed. Lens 200 can be a Fresnel lens. The plurality of equidistant zigzag shapes 201 form a plurality of concentric circles on a surface of the lens 200. A difference in thickness of ordinary lens is large, and after light passes through, a phenomenon occurs wherein corners are darkened and partial regions are blurred. Meanwhile, the lens 200 of the embodiment of the present disclosure is the Fresnel lens. When light passes through the light-guiding medium 110 in the through hole 112, refraction occurs at an interface between an edge region of the lens 200 and the light-guiding medium 110. Since the lens 200 has a plurality of equidistant zigzag shapes 201, light propagating in a straight line in the lens 200 is filtered out and only light at a surface where refraction is generated is retained. After light passes through the lens 200, brightness of images on the imaging device becomes uniform, thereby achieving high quality imaging results. A Lens having the same or similar imaging function as imaging function of the Fresnel lens can be the lens 200 of the embodiment of the present disclosure.

Preferably, in order to further improve transmittance of light, a thinning process is performed on the first flexible layer 100 corresponding to the light-transmissive sub-region B and at a position away from a side of the first barrier layer 101, that is, in a region where a groove is disposed, such that a thickness of the first flexible layer 100 in a display region A is greater than a thickness of the first flexible layer 100 in the light-transmissive sub-region B, further reducing loss of light in the first flexible layer 100.

Furthermore, a plurality of pixel units 107 are further disposed on the organic light-emitting layer 105. The pixel units 107 include a red pixel unit, a blue pixel unit, or a green pixel unit. A density of the pixel units 107 in a region corresponding to the light-transmissive sub-region B is less than a density of the pixel units 107 in a region corresponding to the display region A, so that after light passes through the pixel units 107 in the light-transmissive sub-region B, the loss of light is reduced, thereby increasing light transmittance.

Figure 3:
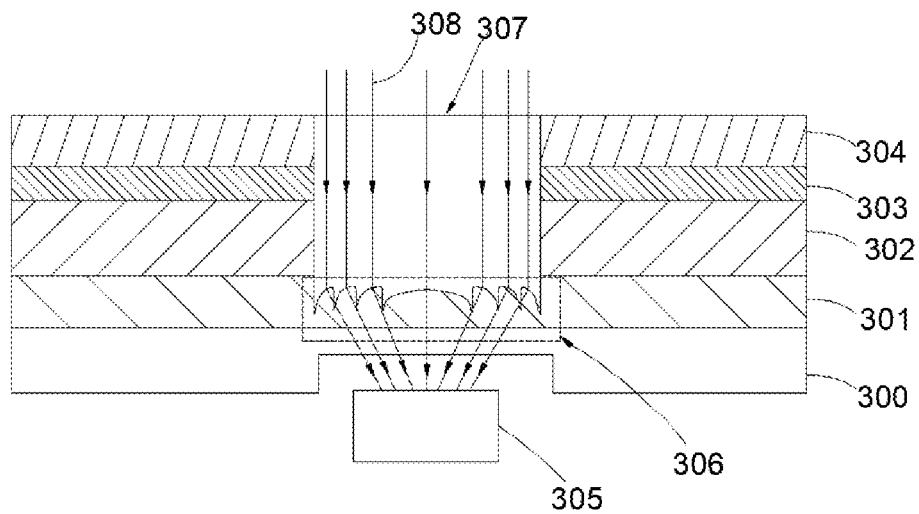
FIG. 3 is a schematic view showing light transmission in the embodiment of the present disclosure.

As shown in FIG. 3, FIG. 3 is a schematic view showing light transmission in an embodiment of the present disclosure. A display device includes a first flexible layer 300, a first barrier layer 301, a second flexible layer 302, a second barrier layer 303, and a thin film transistor layer 304 disposed in sequence. An imaging device 305 and a through hole 307 are further included. A light-guiding lens structure 306 is a Fresnel lens. A light 308 is refracted at an edge of the light-guiding lens structure 306. After refraction is completed, according to Fresnel's principle, light from all places will be concentrated on the imaging device 305, and brightness of all places of the refracted light 308 is uniform. This way, concentrating effect is good and imaging quality is excellent.

Figure 4:
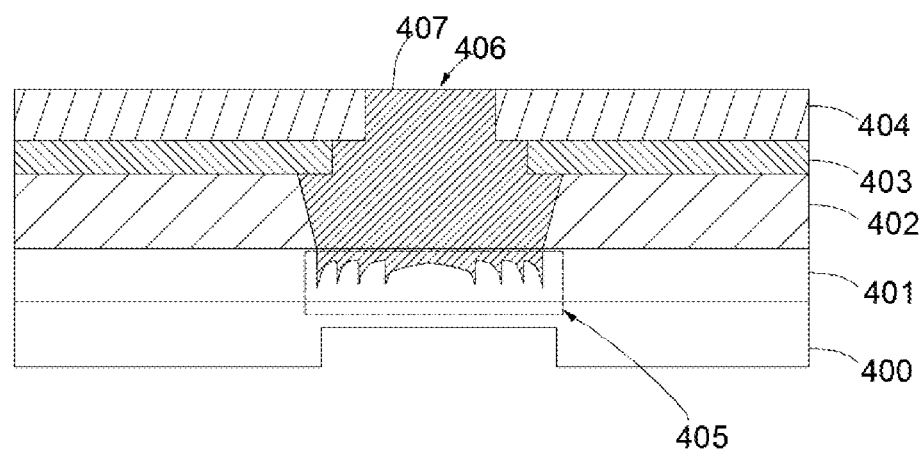
FIG. 4 is a schematic structural view of each layer of a display device according to another embodiment of the present disclosure.

As shown in FIG. 4, FIG. 4 is a schematic structural view of each layer of a display device according to another embodiment of the present disclosure. Compared with the film layer structure in FIG. 1, the difference is mainly in structure of the through hole. The display device includes a first flexible layer 400, a first barrier layer 401, a second flexible layer 402, a second barrier layer 403, and a thin film transistor layer 404, disposed in order from bottom to top. A light-guiding lens structure 405 is further disposed on the first barrier layer. The display device further includes a through hole 406. The through hole 406 is filled with a light-guiding medium 407. The light-guiding medium 407 is mainly a light-transmitting medium, including a polyimide material, to increase transmittance of light.

In the embodiment of the present disclosure, a structure of the through hole 406 is a stepped hole structure. In order to reduce an opening area on a display screen, an aperture diameter of the stepped hole on the thin film transistor layer 404 is less than an aperture diameter of other film layers. At the same time, on the second flexible layer 402, the through hole 406 is set as a tapered hole, which not only enlarges the propagation path of light, but also facilitates production and manufacturing, and saves materials, thereby effectively reducing production cost.

Figure 5:
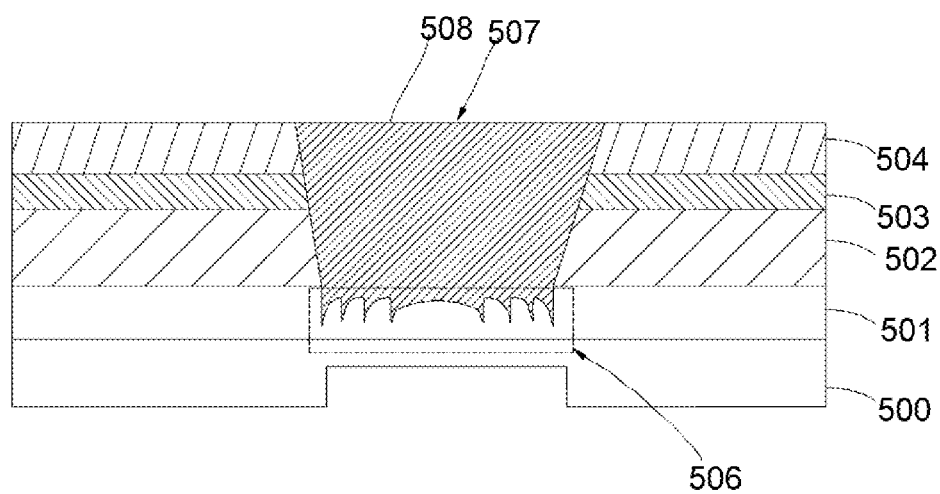
FIG. 5 is a schematic structural view of each layer of a display device according to yet another embodiment of the present disclosure.

As shown in FIG. 5, FIG. 5 is a schematic structural view of each film layer of a display device according to yet another embodiment of the present disclosure. The display device includes a first flexible layer 500, a first barrier layer 501, a second flexible layer 502, a second barrier layer 503, and a thin film transistor layer 504, disposed in order from bottom to top. Compared with the film layer structure in FIG. 1, in the embodiment of the present disclosure, a through hole 507 is a tapered hole, and the through hole 507 is filled with a light-guiding medium 508. At this time, an aperture diameter of an upper end of the through hole 507 is greater than an aperture diameter of a lower end of the through hole 507, so that more light can enter the display panel from the upper end of the through hole 507 and further reach an internal imaging device. An emission layer can also be disposed at an edge of the through hole 507 to prevent light leakage in an edge region of the through hole 507 from affecting light transmittance.

Figure 6:
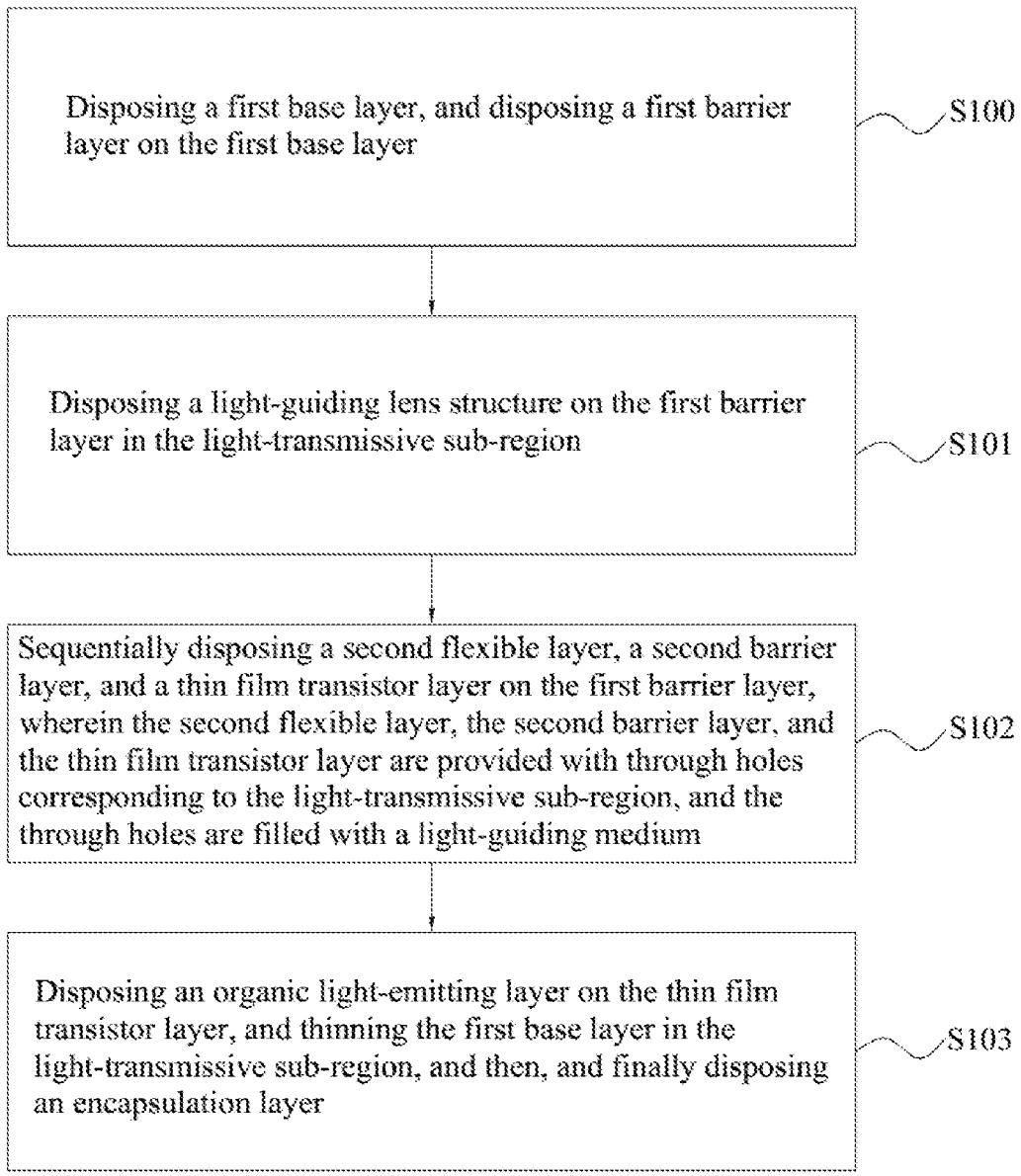
FIG. 6 is a schematic flowchart of a process for fabricating the display device according to the embodiment of the present disclosure.

The embodiment of the present disclosure further provides a method for fabricating a display device. As shown in FIG. 6, FIG. 6 is a schematic flowchart of a process for fabricating a display device according to an embodiment of the present disclosure. Specifically, the following steps are included:

S100: disposing a first base layer, and disposing a first barrier layer on the first base layer.

Firstly, the first base layer is disposed, and then, the first barrier layer is deposited on the first base layer.

S101: disposing a light-guiding lens structure on the first barrier layer in the light-transmissive sub-region.

In order to improve light transmittance of light, in the embodiment of the present disclosure, the light-transmissive sub-region of the first barrier layer is patterned, and a concentric Fresnel lens structure is formed on the surface of the first barrier layer by etching.

S102: sequentially disposing a second flexible layer, a second barrier layer, and a thin film transistor layer on the first barrier layer, wherein the second flexible layer, the second barrier layer, and the thin film transistor layer are provided with a through hole corresponding to the light-transmissive sub-region, and the through hole is filled with a light-guiding medium.

After the first barrier layer of an optical component is disposed, the remaining film layers of the display device are sequentially disposed, and a through hole is formed in the film layers corresponding to the light-transmissive sub-region to further improve transmittance of light. The through hole can be realized by a photolithography process such as etching or exposure. After the through hole is defined, a medium is filled in the through hole, and the filled medium can effectively reduce absorption of light.

S103: disposing an organic light-emitting layer on the thin film transistor layer, and thinning the first base layer in the light-transmissive sub-region, and then, finally carrying out an encapsulation.

After the disposing of step S102 is completed, the organic light-emitting layer and an encapsulation layer are proceeded to be disposed on the display device, and the encapsulation layer is deposited by a deposition process to protect the entire display device. At the same time, in order to improve light transmittance of light in the light-transmissive region, thinning process is performed on the first base layer in the light-transmissive sub-region to improve service life of the display device.

Finally, the display device in the embodiment of the present disclosure is obtained.

The display device and the method for fabricating the display device provided by the embodiments of the present disclosure are described in detail above. The description of the above embodiments is only for helping to understand the technical solution of the present disclosure and its core ideas. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display device, comprising:
    a display region comprising a light-transmissive sub-region for transmitting light to an under-screen camera, the display device comprising:
    a first base layer;
    a second base layer disposed on the first base layer;
    a thin film transistor layer disposed on the second base layer; and
    an organic light-emitting layer disposed on the thin film transistor layer;
    wherein the second base layer and the thin film transistor layer are provided with a through hole corresponding to the light-transmissive sub-region, the through hole comprises a stepped hole, and the through hole is filled with a light-guiding medium;
    wherein a side of the first base layer facing the second base layer is provided with a light-guiding lens structure corresponding to the light-transmissive sub-region, and the light-guiding lens structure comprises a Fresnel lens.

2. The display device of claim 1, wherein a side of the light-guiding lens structure is provided with a plurality of equidistant zigzag shapes, and the equidistant zigzag shapes form a plurality of concentric circles on a surface of the light-guiding lens structure.

3. The display device of claim 1, wherein the first base layer comprises:
    a first flexible layer, wherein a thickness of the first flexible layer corresponding to the light-transmissive sub-region is less than a thickness of the first flexible layer corresponding to the display region excluding the light-transmissive sub-region; and
    a first barrier layer disposed on the first flexible layer, wherein the light-guiding lens structure is disposed on a side of the first barrier layer away from the first flexible layer and corresponding to the light-transmissive sub-region.

4. The display device of claim 3, wherein a side of the first flexible layer away from the first barrier layer is provided with a groove corresponding to the light-transmissive sub-region.

5. The display device of claim 1, wherein the second base layer comprises:
    a second flexible layer disposed on the first barrier layer; and
    a second barrier layer disposed on the second flexible layer;
    wherein the second flexible layer and the second barrier layer are provided with the through hole corresponding to the light-transmissive sub-region.

6. The display device of claim 1, wherein an aperture diameter of the stepped hole in the thin film transistor layer is less than an aperture diameter of the stepped hole in a corresponding region of the second base layer.

7. The display device of claim 1, wherein a periphery of the light-guiding medium comprises a reflective layer, the reflective layer enclosing the light-guiding medium and conforming to an inner surface of the through hole.

8. The display device of claim 1, wherein the organic light-emitting layer comprises a plurality of pixel units, and a density of the pixel units in the display region is greater than a density of the pixel units in the light-transmissive sub-region.

9. The display device of claim 1, wherein material of the light-guiding medium comprises polyimide.

10. A display device, comprising:
a display region comprising a light-transmissive sub-region for transmitting light to an under-screen camera, the display device comprising:
a first base layer;
a second base layer disposed on the first base layer;
a thin film transistor layer disposed on the second base layer; and
an organic light-emitting layer disposed on the thin film transistor layer;
wherein the second base layer and the thin film transistor layer are provided with a through hole corresponding to the light-transmissive sub-region, and the through hole is filled with a light-guiding medium;
wherein a side of the first base layer facing the second base layer is provided with a light-guiding lens structure corresponding to the light-transmissive sub-region.

11. The display device of claim 10, wherein the light-guiding lens structure comprises a Fresnel lens.

12. The display device of claim 11, wherein a side of the light-guiding lens structure is provided with a plurality of equidistant zigzag shapes, and the equidistant zigzag shapes form a plurality of concentric circles on a surface of the light-guiding lens structure.

13. The display device of claim 10, wherein the first base layer comprises:
a first flexible layer, wherein a thickness of the first flexible layer corresponding to the light-transmissive sub-region is less than a thickness of the first flexible layer corresponding to the display region excluding the light-transmissive sub-region; and
a first barrier layer disposed on the first flexible layer, wherein the light-guiding lens structure is disposed on a side of the first barrier layer away from the first flexible layer and corresponding to the light-transmissive sub-region.

14. The display device of claim 13, wherein a side of the first flexible layer away from the first barrier layer is provided with a groove corresponding to the light-transmissive sub-region.

15. The display device of claim 10, wherein the second base layer comprises:
a second flexible layer disposed on the first barrier layer; and
a second barrier layer disposed on the second flexible layer;
wherein the second flexible layer and the second barrier layer are provided with the through hole corresponding to the light-transmissive sub-region.

16. The display device of claim 10, wherein the through hole comprises a stepped hole, and an aperture diameter of the stepped hole in the thin film transistor layer is less than an aperture diameter of the stepped hole in a corresponding region of the second base layer.

17. The display device of claim 10, wherein a periphery of the light-guiding medium comprises a reflective layer, the reflective layer enclosing the light-guiding medium and conforming to an inner surface of the through hole.

18. The display device of claim 10, wherein the organic light-emitting layer comprises a plurality of pixel units, and a density of the pixel units in the display region is greater than a density of the pixel units in the light-transmissive sub-region.

19. The display device of claim 10, wherein material of the light-guiding medium comprises polyimide.

* * * * *